United States Patent [19]
Kimura et al.

[11] Patent Number: 5,652,528
[45] Date of Patent: Jul. 29, 1997

[54] TRANSCEIVER CIRCUIT AND METHOD OF TRANSMITTING A SIGNAL WHICH USES AN OUTPUT TRANSISTOR TO SEND DATA AND ASSIST IN PULLING UP A BUS

[75] Inventors: Masaharu Kimura, Ome; Toshiro Takahashi, Hamura, both of Japan

[73] Assignee: Hitachi, Ltd., Tokyo, Japan

[21] Appl. No.: 560,368

[22] Filed: Nov. 17, 1995

[30]     Foreign Application Priority Data

Nov. 25, 1994  [JP]  Japan .................. 6-291771

[51] Int. Cl.$^6$ ............................... H03K 19/0185
[52] U.S. Cl. ................................ 326/83; 326/85
[58] Field of Search ..................... 326/82, 83, 86, 326/17, 85

[56]              References Cited

U.S. PATENT DOCUMENTS

| | | | |
|---|---|---|---|
| 4,581,551 | 4/1986 | Campbell, Jr. ............... | 326/83 |
| 4,680,487 | 7/1987 | Kobayashi .................. | 326/86 |
| 5,347,177 | 9/1994 | Lipp ......................... | 326/30 |
| 5,530,377 | 6/1996 | Walls ........................ | 326/86 |

OTHER PUBLICATIONS

"CMOS Small–Amplitude Interface Is Standardized To Give A Signal Amplitude of Smaller than 1 V"; published by Nikkei Electronics; Jun. 8, 1992; pp. 133–141 (with translation).

*Primary Examiner*—Edward P. Westin
*Assistant Examiner*—Benjamin D. Driscoll
*Attorney, Agent, or Firm*—Antonelli, Terry, Stout & Kraus, LLP

[57]              ABSTRACT

A semiconductor integrated circuit device having an input/output circuit for inputting and outputting data having a GTL level includes a pull-down output MOSFET (Q1) and a pull-up output MOSFET (Q2) both electrically connected to an input/output terminal and a gate drive signal generating circuit (DPG) electrically coupled to the gate of the pull-up output MOSFET (Q2). Upon data transmission, the gate drive signal generating circuit (DPG) controls the operation of the output MOSFET (Q2) so that the output MOSFETs (Q1 and Q2) are contemporarily brought into an ON or OFF state according to data to be transmitted. On the other hand, upon data reception, the gate drive signal generating circuit (DPG) forms a control pulse for temporarily turning ON one of the output MOSFETS (Q2) immediately after high-level data has been received, and supplies it to a gate terminal of the output MOSFET (Q2).

13 Claims, 7 Drawing Sheets

TRANSCEIVER CIRCUIT AND METHOD OF TRANSMITTING A SIGNAL WHICH USES AN OUTPUT TRANSISTOR TO SEND DATA AND ASSIST IN PULLING UP A BUS

BACKGROUND OF THE INVENTION

The present invention relates to a technique for transmitting a signal between semiconductor integrated circuit devices (ICs) and more specifically to a technique applied to and effective for an input/output circuit of a semiconductor integrated circuit device suitable for the transmission of a signal whose amplitude is small like GTL level (Gunning transceiver logic level). The present invention relates to, for example, a technique suitable for use in the transmission of a signal between semiconductor integrated circuit devices using buses functioning as signal transmission lines, which are employed in a data processing system wherein a plurality of babyboards or daughterboards are mounted on a so-called motherboard.

As a system for transmitting a signal between semiconductor integrated circuit devices, an interface system called "GTL (Gunning transceiver logic)" for performing transmission and reception of a signal whose amplitude is about 0.8 V (whose high level is 1.2 V and whose low level is 0.4 V) has been proposed (see Nikkei Electronics, Jun. 8, 1992, p.p. 133–141).

Figure 8:
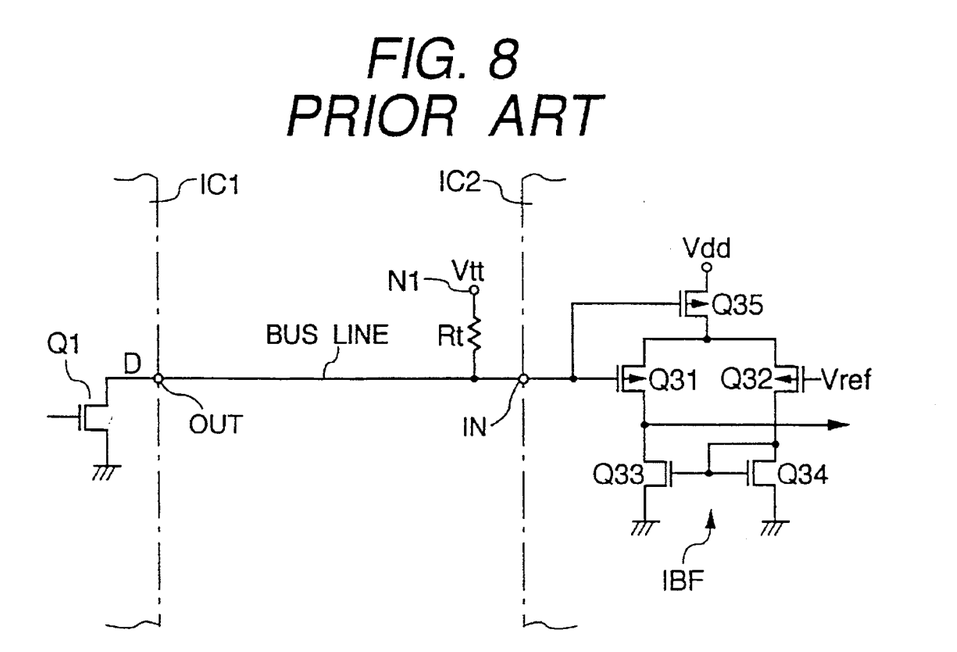
FIG. 8 is a circuit diagram showing an outline of a signal transmission system provided between semiconductor integrated circuit devices to each of which the GTL circuit is applied.

FIG. 8 is a circuit diagram showing a system for transmitting a signal between semiconductor integrated circuit devices under a GTL which has been discussed by the present inventors before the disclosure of the present invention. As shown in FIG. 8, an output circuit of a semiconductor integrated circuit device IC1 on the transmitting side is of an open-drain type or mode in which a drain terminal D of an output MOSFET (Metal-Oxide-Semiconductor Field Effect Transistor) Q1 is directly connected to an output pin (external output terminal) OUT. An input circuit IBF of a semiconductor integrated circuit device IC2 on the receiving side comprises a CMOS differential circuit (CMOS: Complementary-Metal-Oxide-Semiconductor Field Effect Transistor) electrically connected to an input pin (external input terminal) IN. A bus line (BUS line) used as a signal transmission line is provided between the output pin OUT and the input pin IN. Further, an terminal resistor Rt is connected between a node N1 supplied with a terminal voltage Vtt and the bus line.

SUMMARY OF THE INVENTION

Figure 9:
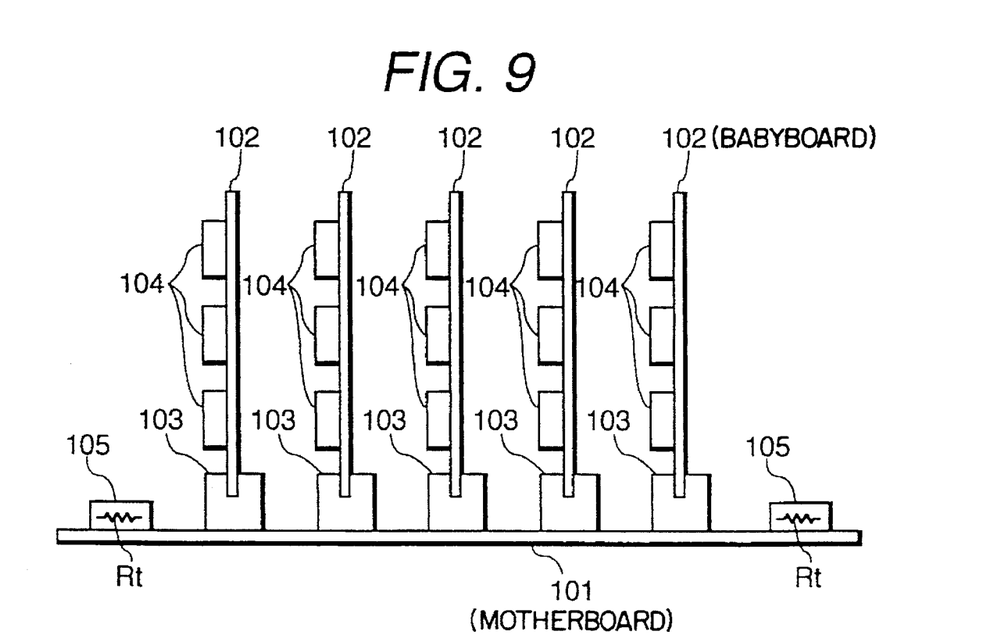
FIG. 9 is a side view showing one exemplified configuration of a system composed of a motherboard and babyboards, which is used as one example of a suitable system to which the present invention is applied.

FIG. 9 shows a data processing system discussed by the present inventors. Namely, the data processing system includes a so-called motherboard 101, a plurality of connectors 103 provided on the motherboard 101 and a plurality of so-called babyboards 102 vertically inserted into their corresponding connectors 103 as shown in FIG. 9. The babyboards 102 are electrically connected to one another by a bus line comprised of printed wiring or the like provided on the motherboard 101. The present inventors has discussed the application of the signal transmission system using the open-drain type output circuit shown in FIG. 8 to the transmission of the signal between the different babyboards 102 employed in the data processing system shown in FIG. 9. A data processing system comprised of semiconductor integrated circuit devices 104 such as a microprocessor (MPU), memories (MEMs), an interface peripheral circuit (ITF), etc. is mounted on each babyboard 102. Reference numerals 105 in FIG. 9 indicate terminal resistors Rt electrically connected between ends of individual signal lines forming a bus line and a terminal voltage Vtt.

However, the present inventors have found out the following items.

Figure 10:
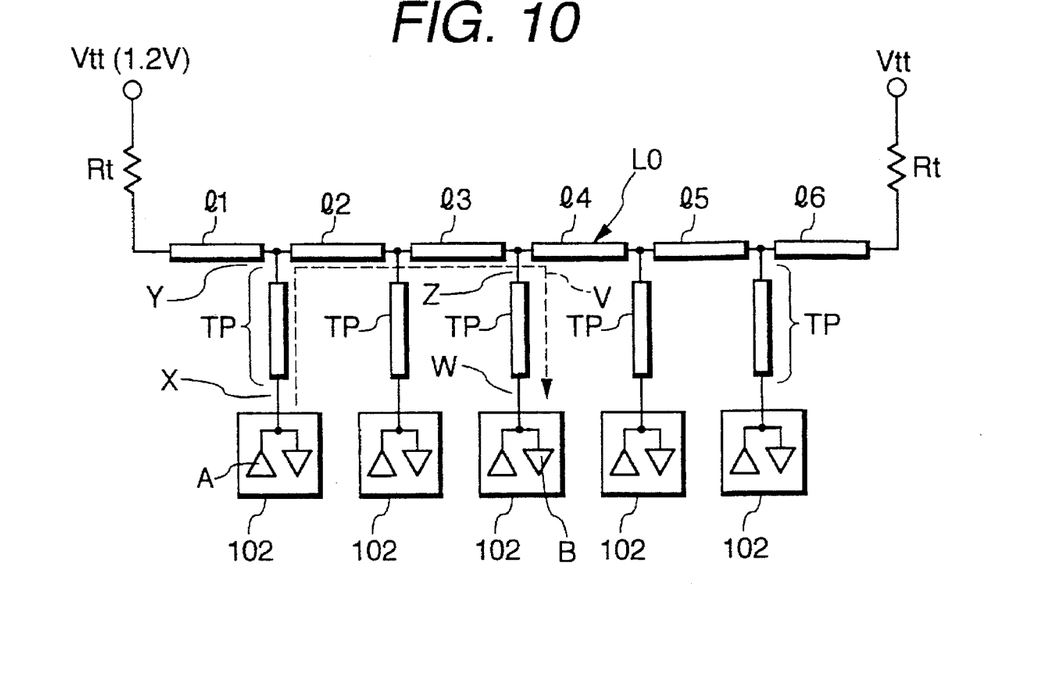
FIG. 10 is an equivalent circuit diagram showing an equivalent circuit of the system shown in FIG. 9.

FIG. 10 is an equivalent circuit diagram of signal transmission paths between a main transmission line L0 indicative of the bus line on the motherboard 101 shown in FIG. 9 and a plurality of babyboards 102. The main transmission line L0 is connected between terminal voltages Vtt with terminal resistors Rt interposed therebetween and has impedance components L1 through L1. Further, the plurality of babyboards 102 are electrically connected to the main transmission line L0 through portions TP called tapoffs. Referring to FIG. 10, now consider where each of semiconductor integrated circuit devices on the signal transmitting side is regarded as A, each of semiconductor integrated circuit devices on the signal receiving side is regarded as B, an output circuit of each semiconductor integrated circuit device A comprises the open-drain type output circuit shown in FIG. 8 and an input circuit of each semiconductor integrated circuit device B comprises the CMOS differential circuit shown in FIG. 8.

When a signal is now outputted from an output circuit of a semiconductor integrated circuit device A in this case, the signal is reflected onto an entrance X and an exit Y of a tapoff TP due to an impedance mismatch, thereby causing ringings of the signal. On the other hand, the signal reaches an input circuit of a semiconductor integrated circuit device B on the transmitting side as indicated by a dotted line V. Since the gate of the input transistor Q31 of the CMOS differential circuit is high in impedance, the signal is reflected onto the gate of the input transistor Q31 as is understood from FIG. 8. The signal reflected by the gate of the input transistor Q31 is reflected from or by an exit Z of a tapoff TP due to an impedance mismatch, thereby causing signal ringings between the exit Z and an entrance W. It therefore became evident that a large ringing occurs in the waveform of an input signal as indicated by a dotted line CSW in FIG. 5.

Particularly when the output MOSFET Q1 of the output circuit in the semiconductor integrated circuit device A on the transmitting side is turned OFF to output a high level signal, the drain terminal D of the output MOSFET Q1 is brought into an open state. Therefore, the output impedance of the output circuit of the semiconductor integrated circuit device A on the transmitting side becomes so high. Thus, the output impedance thereof does not match with the impedance of the transmission path and ringings exceeding a threshold voltage (Vref) of the input circuit of the semiconductor integrated circuit device B occur immediately after the transmission signal has changed from a low to a high level. When a ringing such as a portion M indicated by diagonally-shaped areas in FIG. 5, for example, occurs, the input circuit of the semiconductor integrated circuit device B is apt to malfunction.

An object of the present invention is to provide a semiconductor integrated circuit device having an input/output circuit capable of reducing ringings of a waveform of an input signal upon signal transmission through a bus.

Another object of the present invention is to provide a semiconductor integrated circuit device capable of implementing a signal transmission system which makes it possible to transmit a signal at high speed while suppressing the generation of noise.

A further object of the present invention is to provide a signal transmission system which makes it possible to transmit a signal at high speed while suppressing the generation of noise.

The above and other objects, and novel features of the present invention will become apparent from the description of the present specification and the accompanying drawings.

Typical ones of the invention disclosed in the present application may be summarized in the following outline. It is noted that the identifying legends given below are solely for purposes of example, and are not intended to limit the invention only to the illustrated embodiments.

Namely, a first semiconductor integrated circuit device according to the present invention comprises:

an input/output terminal (I/O);

a first output MOSFET (QI) having a source-drain path connected between the input/output terminal (I/O) and a first source terminal (GND);

a second output MOSFET (Q2) having a source-drain path connected between the input/output terminal (I/O) and a second source terminal (Vtt);

a first gate drive signal generating circuit (GDV) connected to a gate of the first output MOSFET (Q1), for selectively generating a drive signal to be supplied to the gate of the first output MOSFET (Q1) in response to data to be transmitted;

an input circuit (IBF) having an input MOSFET (Q32) whose gate is connected to the input/output terminal (I/O); and a second gate drive signal generating circuit (DPG) connected to a gate of the second output MOSFET (Q2).

The second gate drive signal generating circuit (DPG) selectively generates a drive signal to be supplied to the gate of the second output MOSFET (Q2) in response to data to be transmitted, upon data transmission. As a result, the operation of the second output MOSFET (Q2) is controlled by the second gate drive signal generating circuit (DPG) so that the first output MOSFET (Q1) and the second output MOSFET (Q2) are complementarily activated.

On the other hand, the second gate drive signal generating circuit (DPG) forms a control signal (control pulse) for temporarily turning on the second output MOSFET (Q2) based on an input signal outputted from the input circuit in response to a high level input signal supplied to the input/output terminal (I/O) upon data reception.

Preferably, the first output MOSFET (Q1) is provided in plural form and the first gate drive signal generating circuit (GDV) is provided with the function of controlling the gate voltages to be supplied to the plurality of first output MOSFETs (Q1) so as to turn on the first output MOSFETs (Q1) with a time delay between these. As result, the first gate drive signal generating circuit (GDV) is constructed so as to have a slew rate control function capable of controlling a slew rate, i.e., rise and fall speeds of an output signal.

A second semiconductor integrated circuit device according to the present invention comprises:

an input terminal (I/O);

an output MOSFET (Q2) having a source-drain path connected between the input terminal (I/O) and a second source terminal (Vtt);

an input circuit (IBF) having an input MOSFET (Q32) whose gate is connected to the input terminal (I/O); and a gate drive signal generating circuit (DPG) connected to a gate of the second output MOSFET (Q2).

The gate drive signal generating circuit (DPG) forms a control pulse for temporarily turning on the second output MOSFET (Q2) based on an input signal outputted from the input circuit in response to a high level input signal supplied to the input terminal (I/O).

According to the means referred to above, the following effects can be brought about.

Namely, when high level data (signal) is outputted, the first output MOSFET (Q1) is turned OFF by the first gate drive signal generating circuit (GDV) and the second output MOSFET (Q2) is turned ON by the second gate drive signal generating circuit (DPG). As a result, the input/output terminal (I/O) can be avoided from remaining kept at a high impedance state during a period in which the high level data (signal) is outputted.

On the other hand, when low level data (signal) is outputted, the firs output MOSFET (Q1) is turned ON by the first gate drive signal generating circuit (GDV) and the second output MOSFET (Q2) is turned OFF by the second gate drive signal generating circuit (DPG). It is thus possible to avoid the input/output terminal (I/O) from remaining kept at a high impedance state during a period in which the low level data (signal) is outputted.

Further, upon reception of data (signal), the second output MOSFET (Q2) is temporarily turned ON by the second gate drive signal generating circuit (DPG) immediately after the reception of the high level data (signal). Therefore, the input/output terminal (I/O) can be prevented from remaining held in a high impedance state, thereby making it possible to restrain the reflection of the signal onto the input/output terminal (I/O). As a result, ringings of a waveform of an input signal can be greatly reduced even when the input circuit (IBF) includes the input MOSFET (Q32) having the gate connected to the input/output terminal (I/O).

Furthermore, rise and fall speeds of an output signal can be controlled by providing the first gate drive signal generating circuit (GDV) with a slew rate control function, thereby making it possible to improve a signal transmission rate while noise is prevented from being produced in the output signal due to the fact that the signal rises too fast. Still further, according to the above circuit mode, since a signal whose amplitude is small like a GTL level, can be input and output by connecting a terminal resistor to an input/output terminal of each semiconductor integrated circuit device, the signal can be transmitted at high speed.

BRIEF DESCRIPTION OF THE DRAWINGS

The invention will be described with reference to the accompanying drawings wherein.

DETAILED DESCRIPTION OF THE PREFERRED EMBODIMENTS

Preferred embodiments of the present invention will hereinafter be described with reference to the accompanying drawings.

Figure 1:
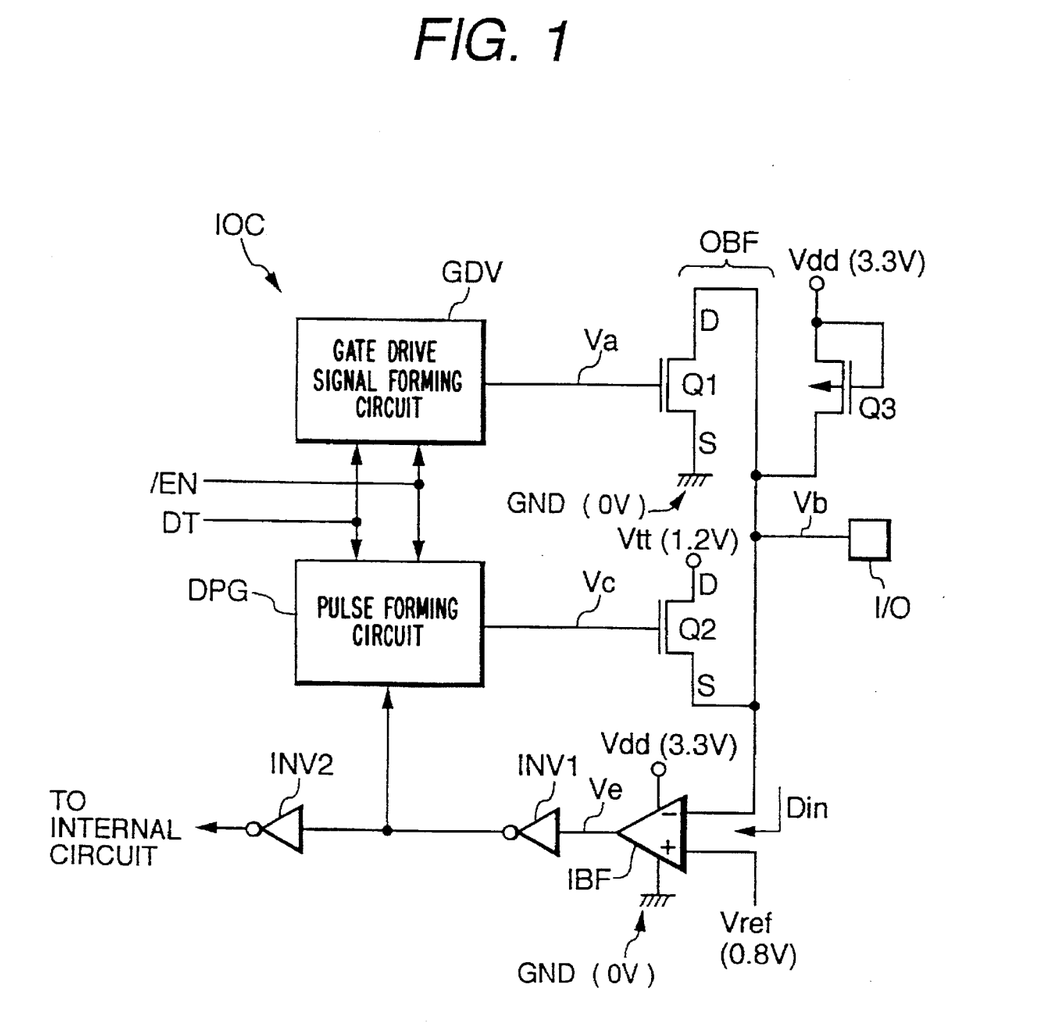
FIG. 1 is a circuit diagram showing one embodiment of an input/output circuit of a semiconductor integrated circuit device to which the invention is applied.

FIG. 1 shows one embodiment of an input/output circuit (IOC) of a semiconductor integrated circuit device (e.g., a CMOS logic semiconductor integrated circuit device) to which the present invention is applied. This input/output circuit IOC is used as an input/output circuit for transmitting a signal whose amplitude is a GTL level (Gunning transceiver logic level) such as about 0.8 V (whose high and low levels are 1.2 V and 0.4 V respectively) therefrom and receiving it therein. The semiconductor integrated circuit device is formed on a monocrystalline semiconductor substrate such as silicon or the like, based on a known CMOS manufacturing method. Although no particular limitation is imposed to the semiconductor integrated circuit device, an internal circuit employed in the semiconductor integrated circuit device of the embodiment is composed of a known CMOS logic gate circuit.

As shown in FIG. 1, the input/output circuit IOC according to the present embodiment comprises a push-pull output circuit OBF and an input circuit IBF composed of a differential circuit. The output circuit OBF and the input circuit IBF are electrically connected to a common input/output terminal (I/O).

The output circuit OBF includes an output MOSFET (first MOSFET) Q1 used as a pull-down output transistor and an output MOSFET (second output MOSFET) Q2 used as a pull-up output transistor.

The output MOSFET Q1 includes a drain terminal D electrically connected to the input/output terminal I/O and a source terminal S electrically connected to a first source voltage terminal supplied with a ground potential GND such as 0 V. On the other hand, the output MOSFET Q2 includes a drain terminal D electrically connected to a second source voltage terminal supplied with a source voltage (terminal voltage) Vtt such as 1.2 V and a source terminal S electrically connected to the input/output terminal I/O. Although no particular limitation is imposed on conductivity type of each of the output MOSFETs Q1 and Q2, both MOSFETs are set to N-channel type. In order to optimize a balance between driving power or forces of the output MOSFETs Q2 and Q1, gate widths of the output MOSFETs Q2 and Q1 are determined or decided so that the ratio between element sizes (gate widths) of the output MOSFETs Q2 and Q1 is at or between 1:2 and 1:3. Namely, since the output MOSFETs Q1 and Q2 are activated complementarily to each other as will be described later, care is necessary to the fact that the low and high levels of the output signal are not brought to the GTL level unless the balance between the driving forces of the output MOSFETs Q2 and Q1 is suitably set. Therefore, the ratio between the element sizes (gate widths) of the output MOSFETs Q2 and Q1 is set so as to be at or between 1:2 and 1:3 in the present invention.

A first gate drive signal forming circuit (first gate drive signal generating circuit) for providing a gate electrode of the output MOSFET Q1 with a gate drive signal, based on data DT to be outputted and an output enable signal /EN indicative of either an output mode or an input mode, is provided to drive or activate the pull-down output MOSFET Q1. Further, a pulse forming circuit DPG used as a second gate drive signal forming circuit (second gate drive signal generating circuit) for providing a gate electrode of the output MOSFET Q2 with a gate drive signal (pulse) based on the data DT to be outputted, the output enable signal /EN and an input signal Din is provided to drive the output MOSFET Q2. It is needless to say that the output enable signal /EN and the data DT are formed and supplied by the internal circuit.

Each of the gate drive signal forming circuit GDV and the pulse forming circuit DPG is composed of a CMOS circuit activated between a source voltage Vdd such as 3.3 V and the ground potential GND as will described later. Thus, even if the output MOSFET Q2 is of an N-channel type configuration, a sufficient high voltage (3.3 V) can be applied to the gate of the output MOSFET Q2 upon outputting the output signal high in level. Therefore, the level of the terminal voltage Vtt of 1.2 V is substantially outputted without the voltage level of the output signal being reduced from the level of the terminal voltage Vtt. Further, since the output MOSFET Q2 is of an N-channel type configuration, the output MOSFET Q2 can bring about an advantage that its operating speed is made faster as compared with the case where it is of a P-channel type configuration.

On the other hand, the input circuit IBF comprises a CMOS differential circuit having an inverse input terminal (−) to which the input/output pin (I/O) is electrically connected and a non-inverse input terminal (+) supplied with a reference voltage Vref (0.8 V) corresponding to an input logical threshold value. Thus, the input circuit IBF compares the input signal Din and the reference voltage Vref and judges or determines the voltage level of the input signal Din from the result of comparison. Thereafter, the input circuit IBF sends a high level "1" or a low level "0" of the input signal Din to the internal circuit through inverters INV1 and INV2.

Although no particular limitation is imposed on the embodiment illustrated in FIG. 1, a P channel type MOSFET Q3 for prevention of electrostatic breakdown is electrically connected between the input/output terminal I/O and the source voltage terminal Vdd. Using a parasitic capacity between the substrate and the drain of the P channel type MOSFET Q3, the P channel type MOSFET Q3 protects gate insulating films of both the output MOSFETs Q1 and Q2 and an input transistor (corresponding to a MOSFET Q32 of FIG. 6, which will be described later) of the input circuit IBF from, for example, an electrostatic discharge applied to the input/output terminal I/O and prevents the gate insulating films of the output MOSFETs Q1 and Q2 and the MOSFET Q32 from breaking down.

Figure 2:
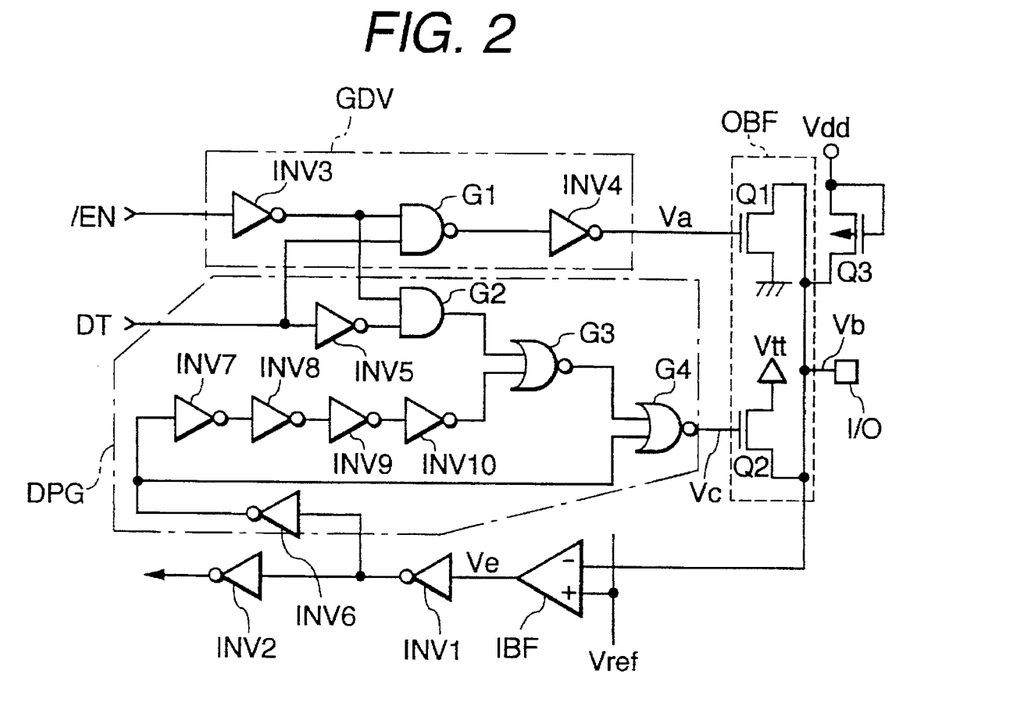
FIG. 2 is a circuit diagram illustrating a specific example of the embodiment shown in FIG. 1.

FIG. 2 shows examples of specific circuit configurations of the gate drive signal forming circuit GDV and the pulse forming circuit DPG shown in FIG. 1. The gate drive signal forming circuit GDV comprises an inverter INV3 for inverting the output enable signal /EN, a NAND gate G1 for receiving therein a signal outputted from the inverter INV3 and the data signal DT to be outputted, as input signals, and an inverter INV4 for inverting a signal outputted from the NAND gate G1 and supplying the inverted signal to the gate of the output MOSFET Q1.

Further, the pulse forming circuit DPG comprises an inverter INV5 for inverting the data signal DT, a NAND gate G2 for receiving therein a signal outputted from the inverter INV5 and the output signal (corresponding to the inverse of the output enable signal /EN) of the inverter INV3 as input signals, a NOR gate G3 for receiving therein a signal outputted from the NAND gate G2 and outputs produced from a series of inverters INV6 through INV10 for delaying a signal outputted from the INV1 on the input circuit side, as input signals, and a NOR gate G4 for receiving therein a signal outputted from the NOR gate G3 and the output produced from the inverter INV6 as input signals. A signal outputted from the NOR gate G4 is supplied to the gate of the output MOSFET Q2 to activate the MOSFET Q2.

Figure 3:
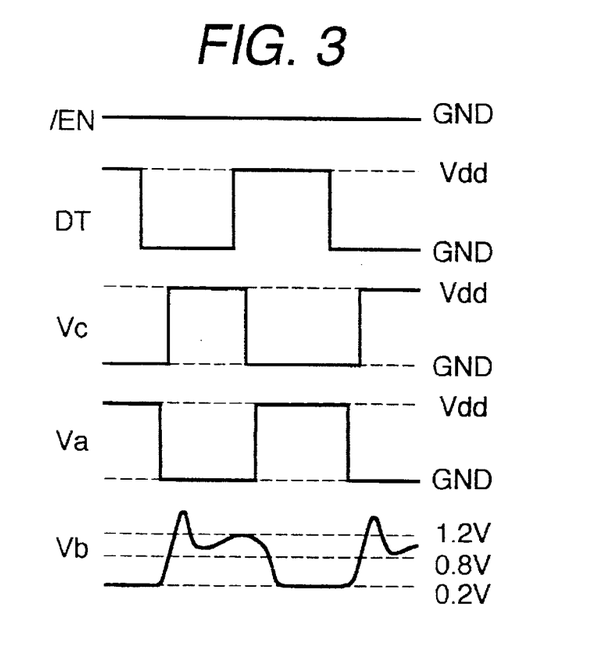
FIG. 3 is a waveform chart for describing waveforms of various signals at the time that the semiconductor integrated circuit device shown in FIG. 1 is in an output mode.
Figure 4:
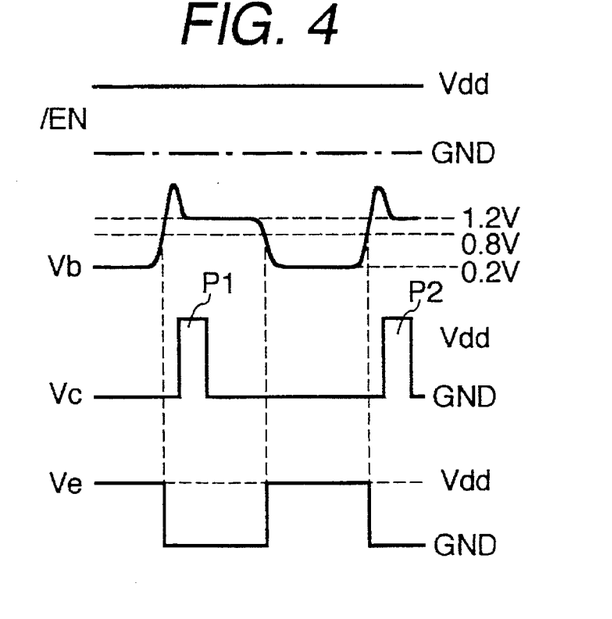
FIG. 4 is a waveform chart for describing waveforms of various signals at the time that the semiconductor integrated circuit device shown in FIG. 1 is in an input mode.

The operation of the input/output circuit shown in FIG. 2 will now be described using timing charts shown in FIGS. 3 and 4. The input/output circuit according to the present embodiment is brought to the output mode when the output enable signal/EN is rendered low in level. On the other hand, when the output enable signal /EN is brought to a high level, the input/output circuit is brought to the input mode.

When the input/output circuit is in the output mode, one of input terminals of the NAND gate G1 is fixed to the high level. When the data signal DT supplied to the other input terminal varies as shown in FIG. 3, a voltage Va applied to the gate of the output MOSFET Q1 varies correspondingly in the same manner as described above, whereby the output MOSFET Q1 is brought into an ON state and an OFF state.

When the data signal DT changes from the high to the low level, for example, the gate voltage Va changes from the high to the low level after a slight delay and hence the output MOSFET Q1 changes from the ON to the OFF state. In doing so, the current that has flowed into the input/output terminal I/O through each of unillustrated terminal resistors (Rt shown in FIG. 10), is cut off so that a potential Vb starts to increase. When the potential Vb exceeds the voltage Vref set as the logical threshold value for the input circuit IBF of the semiconductor integrated circuit device, the output of the input circuit IBF is inverted and the inverted output signal is delayed through the inverter INV6 and the train of inverters INV7 through INV10 and is thereafter supplied to the NOR gates G3 and G4. Therefore, a voltage Vc applied to the gate of the output MOSFET Q2 changes from the low to the high level with a delay slightly from a change in gate voltage Va as shown in FIG. 3. As a result, the output MOSFET Q2 changes from the OFF to the ON state and hence the potential Vb at the input/output terminal I/O approaches the level of the source voltage Vtt.

On the other hand, when the data signal DT changes from the low to the high level, the gate voltage Vc first changes from the high to the low level and then the gate voltage Va changes from the low to the high level. In response to such a change, the output MOSFET Q2 first shifts from the ON to the OFF state and then the output MOSFET Q1 changes from the OFF to the ON state. Hence the potential Vb at the input/output terminal I/O is changed to the ground potential (GND).

Figure 11:
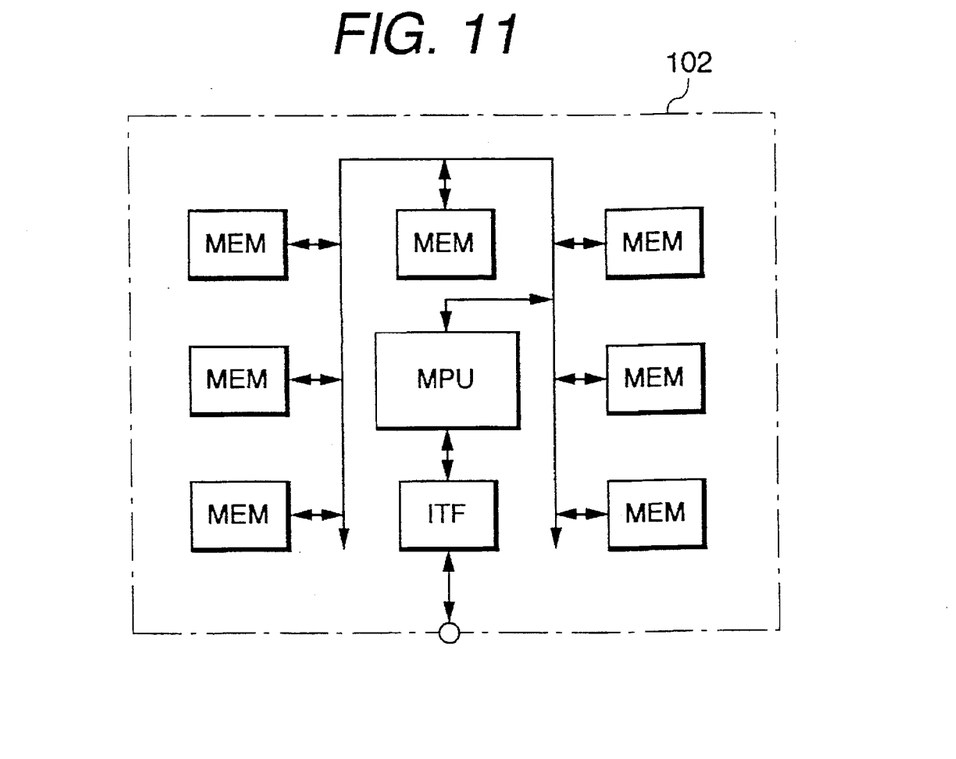
FIG. 11 is a block diagram showing one example of a configuration of a babyboard employed in the system shown in FIG. 9.

In the present embodiment as described above, the output MOSFET Q2 is turned ON when the high level signal is outputted. It is therefore possible to avoid switching the input/output terminal to a high impedance state after the turning OFF of the output MOSFET Q1. Thus, when a data processing system is constructed wherein the semiconductor integrated circuit device according to the present invention is used as a semiconductor integrated circuit device (e.g., an interface peripheral circuit ITF shown in FIG. 11) included in each of babyboards 102 shown in FIG. 10 and bus lines respectively having such tapoffs TP as shown in FIG. 10 are used, the reflection of an output signal, which is developed in both ends of each individual tapoff TP, can be reduced. As a result, any ringing developed due to the reflection of the output signal onto each bus line can be controlled.

Since the gate voltages Va and Vc are set so that their high level periods do not overlap each other, it is possible to minimize the generation of a through-current due to the simultaneous turning ON of the output MOSFETs Q1 and Q2.

Figure 5:
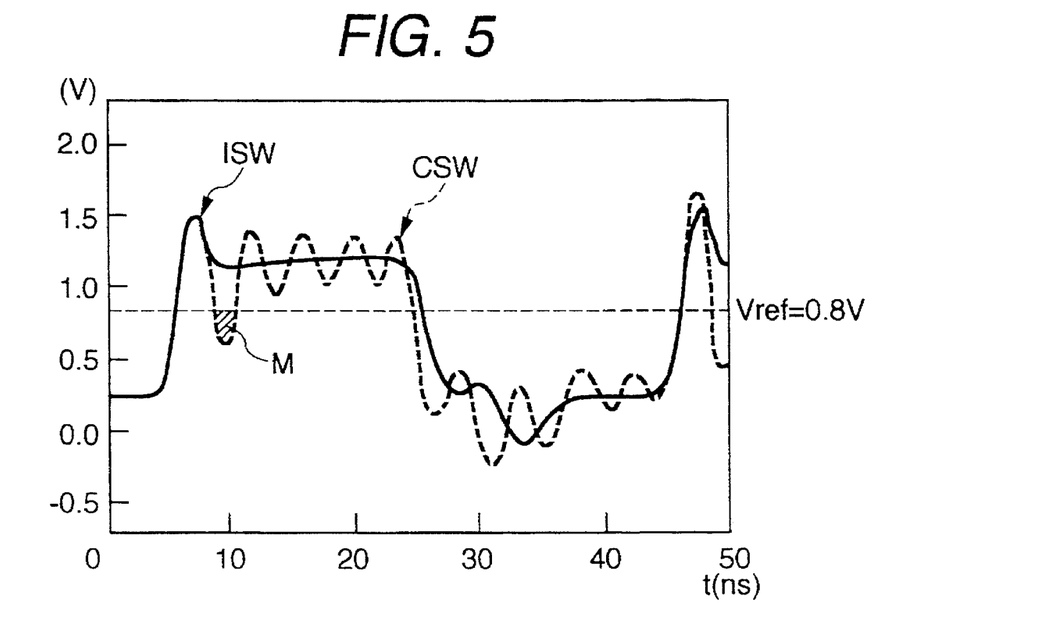
FIG. 5 is a waveform chart for describing waveforms of signals inputted to the semiconductor integrated circuit device shown in FIG. 1 and a conventional GTL circuit.

Next, when the input/output circuit is in the input mode for bringing the output enable signal /EN to the high level, one input terminal of the NAND gate G1 is fixed to the low level. Therefore, the output signal of the NAND gate G1 is fixed to the high level. Thus, since the gate voltage Va of the output MOSFET Q1 is kept at the low level, the output MOSFET Q1 is held in an OFF state. On the other hand, when the input signal, i.e., the potential Vb at the input/output terminal I/O changes from the low to the high level, the gate voltage Va changes from the high to the low level after a slight delay. When the level of the gate voltage Va exceeds the input logic threshold voltage Vref of the input circuit IBF, the output level of the input circuit IBF is inverted and the inverted output signal from the input circuit IBF is delayed through the inverter INV6 and the train of inverters INV7 through INV10, followed by supply to the NOR gates G3 and G4. Therefore, pulse signals (P1 and P2 shown in FIG. 4) each having a time width determined based on the delay time made by the train of inverters INV7 through INV10, are formed by the pulse forming circuit DPG. The pulse signals P1 and P2 are supplied to the gate of the output MOSFET Q2. Thus, since the output MOSFET Q2 is temporarily held in the ON state when the input signal changes from the low to the high level, the impedance measured at the input/output terminal I/O is temporarily brought to low impedance. Therefore, the signal inputted to the input/output terminal I/O can be prevented from reflection. Since the potential Vb is substantially clamped to the level of the source voltage Vtt, a waveform ISW of the input signal is brought to a waveform whose ringing is so reduced as shown in FIG. 5. Thus, when the data processing system is constructed wherein the semiconductor integrated circuit device according to the present invention is used as the semiconductor integrated circuit device (e.g., the interface peripheral circuit ITF shown in FIG. 11) included in each of the babyboards 102 shown in FIG. 10 and the bus lines respectively having such tapoffs TP as shown in FIG. 10 are used, the reflection of the input signal due to the high impedance of the input transistor of the input circuit IBF and the reflection of the input signal, which is developed in both ends of each tapoff TP, can be reduced. As a result, any ringing developed due to the reflection of the input signal onto each bus line can be controlled.

Thus, if the semiconductor integrated circuit device according to the present invention is utilized as the semiconductor integrated circuit device (e.g., the interface peripheral circuit ITF shown in FIG. 11) included in each of the babyboards 102, then the ringing of the signal to be transmitted over each bus line can be effectively controlled. As a result, the signal whose amplitude is small like the GTL level, can be transmitted among the babyboards 102 through the bus lines at high speed and with a high degree of reliability.

Figure 6:
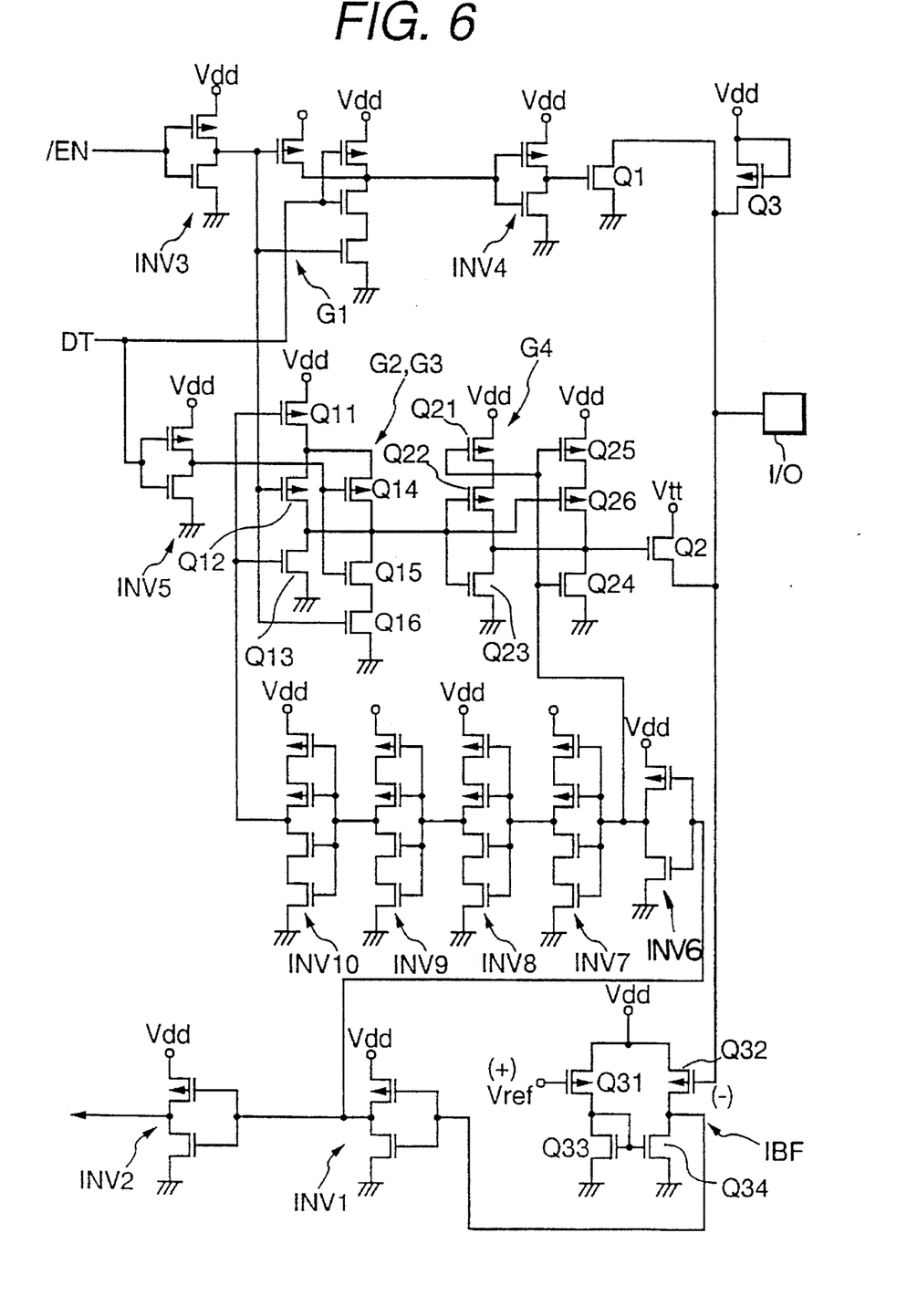
FIG. 6 is a circuit diagram showing a specific example of an elements level circuit employed in the embodiment shown in FIG. 1.

FIG. 6 illustrates a more specific embodiment in which the embodiment shown in FIG. 2 is represented by an elements level circuit. As is apparent from FIG. 6, the inverters INV1 through INV6 are respectively composed of CMOS inverters each comprised of a pair of P and N channel MOSFETs connected to one another in the form of the normal series connected type. On the other hand, the inverters INV7 through INV10 are respectively composed of CMOS inverters each comprised of two P channel MOSFETs and two N channel MOSFETs connected to one another in the form of the series connected type. Thus, the inverters used as delay means having delay times relatively long under a relatively reduced number of stages are constructed so that a pulse having a desired pulse width can be obtained. The number of MOSFETs forming the inverters of respective stages may be changed according to a layout space. Further, the number of inverters to be used may be changed by switching wires in accordance with a master slice method, so that a delay time or pulse width can be changed.

The AND gate G2 and the NOR gate G3 employed in the second embodiment shown in FIG. 2 are formed as a complex logic gate composed of MOSFETs Q11 through Q16 as shown in FIG. 6. The NOR gate G4 comprises four P channel MOSFETs Q21, Q22, Q25 and Q26 and two parallel-connected N channel MOSFETs Q23 and Q24. In the present embodiment, however, the logic threshold value is set so as to become lower than Vdd/2 by suitably setting the ratio between gate widths of the N channel MOSFETs Q23 and Q24. Thus, a through-current can be prevented from flowing into the output MOSFETs Q1 and Q2 by making the timing to fall the gate voltage Vc faster than the timing to rise the gate voltage Va in output mode.

The input circuit IBF comprises a pair of P channel differential input MOSFETs Q31 and Q32 whose common source terminals are electrically connected to the source voltage terminal Vdd, and a pair of current-mirror connected N channel loads MOSFETs Q33 and Q34 connected to the drain terminals of these MOSFETs Q31 and Q32. The input circuit IBF is not necessarily limited to this construction. The input circuit IBF may be one wherein a P channel MOSFET Q35 whose gate is supplied with the input signal, is provided between the differential input MOSFETs Q31 and Q32 and the source voltage terminal Vdd in a manner similar to a circuit shown in FIG. 8.

Figure 7:
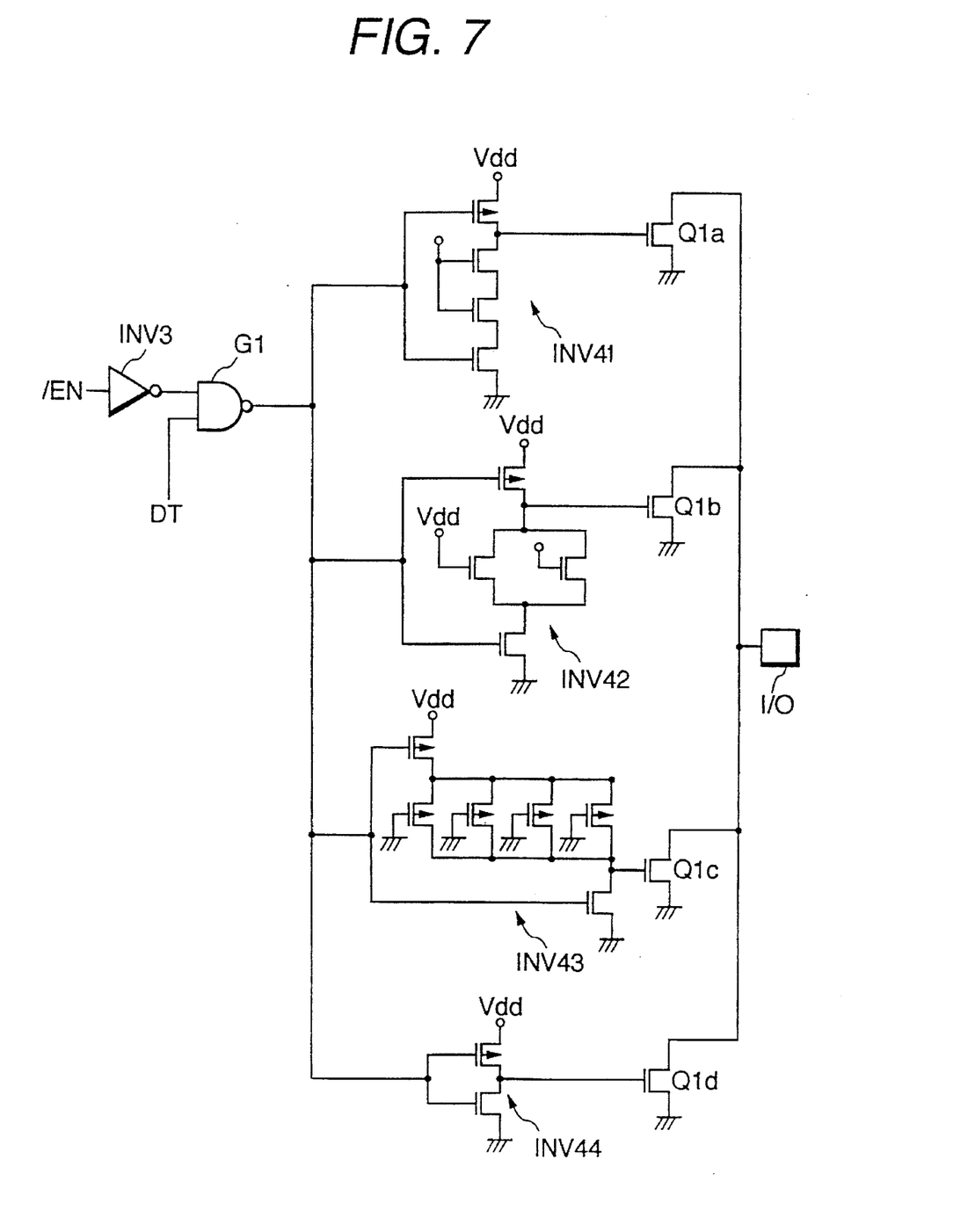
FIG. 7 is a circuit diagram illustrating another embodiment of a gate drive signal generating circuit employed in the embodiment shown in FIG. 1.

FIG. 7 illustrates another embodiment of the present invention.

In the present embodiment, a plurality of output MOSFETs Q1a, Q1b, Q1c and Q1d are provided as the pull-down output MOSFET Q1 shown in FIG. 2. Further, the gate drive signal forming circuit GDV includes a plurality of inverter circuits INV41, INV42, INV43 and INV44 as an alternative to the inverter INV4 shown in FIG. 2 in order to turn ON and OFF the MOSFETs Q1a, Q1b, Q1c and Q1d with a time lag between these MOSFETs. Namely, in the illustrated embodiment, even if the signal is simultaneously inputted to the inverter circuits INV41, INV42, INV43 and INV44 from the prestage NAND gate G1, signals outputted from the inverter circuits INV41, INV42, INV43 and INV44 are changed in timings different from each other by varying the number of elements forming the inverter circuits INV41, INV42, INV43 and INV44 and the way of connecting the elements to one another.

In the present embodiment as well, configurations (such as the number of elements, the gate widths and the way of connecting the element or the like) of the inverter circuits INV41, INV42, INV43 and INV44 have been designed in such a manner that the levels of outputs produced from the output MOSFETs Q1a, Q1b, Q1c and Q1d are changed and when the individual output levels fall, the output MOSFETs Q1a, Q1b, Q1c and Q1d are successively turned ON from the output MOSFET (Q1a) whose output level is lowest to the output MOSFET (Q1d) whose output level is highest, whereas when the individual output levels rise, they are successively turned OFF from the output MOSFET (Q1d) whose output level is highest to the output MOSFET (Q1a) whose output level is lowest, in other words, a slew rate of each output can be controlled. Owing to such a construction, the slew rate, i.e., rise and fall speeds (inclinations or slopes of each waveform shown in FIG. 5) of the output signal can be adjusted or controlled. Thus, a signal transmission rate can be improved while noise produced in the output is reduced.

According to the aforementioned embodiments, as has been described above, the pull-down output MOSFET and the pull-up output MOSFET are electrically connected to the input/output terminal of the semiconductor integrated circuit device. The second gate drive signal generating circuit is provided for complementarily turning ON or OFF the pair of output MOSFETs upon data transmission according to the data to be transmitted, forming the control pulse for temporarily turning ON the pull-up output MOSFET upon receipt of the data immediately after the high-level input signal has been received, and supplying it to the gate terminal of the output MOSFET referred to above. Therefore, when the high-level signal is outputted, the input/output terminal can be prevented from entering into the high impedance, by turning ON the pull-up output MOSFET. Further, since the pull-up output MOSFET is temporarily turned ON on the signal receiving side immediately after the high-level input signal has been received, advantageous effects can be brought about that the signal can be restrained from reflection, the ringing of the waveform of the input signal can be greatly reduced and the circuits on the receiving side can be prevented from malfunctioning.

Further, the first gate drive signal generating circuit is constructed so as to have a slew rate control function capable of forming the signal for controlling the gate voltage of the output MOSFET and controlling the slew rate, i.e., the rise and fall speeds of the output signal upon transmission. Therefore, the rise and fall speeds of the output signal can be controlled, thereby bringing about an advantageous effect that the signal transmission rate can be improved while noise is prevented from being produced due to the fact that the signal rise speed is too fast.

Furthermore, since the semiconductor integrated circuit device utilizes the differential circuit as the input circuit and includes the terminal resistor connected to its corresponding input terminal, the signal whose amplitude is small like the GTL level, can be outputted. Therefore, the semiconductor integrated circuit device can bring about an advantageous effect that the signal can be transmitted at high speed.

The invention, which has been made by the present inventors as described above, has been described specifically by the embodiments. However, the present invention is not necessarily limited to the aforementioned embodiments. It will be apparent to those skilled in the art that many changes and modification can be made without departing from the spirit or scope of the invention as set forth herein. In the above embodiments, both the output MOSFETs Q1 and Q2 are set as the N channel type. However, the output MOSFET Q2 may be of P channel type.

In the aforementioned embodiments as well, the source voltage Vdd is set to 3.3 V and the source voltage Vtt is set to 1.2 V. However, the source voltages are not necessarily limited to these. As an alternative to the source voltage Vdd employed in the embodiments, a source voltage of +2 V or +1.2 V may be used. Further, a ground potential (0 V) may be used in place of the source voltage Vtt and a negative source voltage of −1.2 V may be used in place of the ground potential.

Further, when the present invention is applied to a system shown in FIG. 9 of a type wherein a plurality of so-called babyboards are mounted on a so-called motherboard, it is desirable that terminal resistors 105 are provided in the neighborhood of both ends of a bus for the motherboard 101. However, the terminal resistors 105 may be provided on the motherboard 101.

At least, the present invention can be applied to the input/output circuit of the semiconductor integrated circuit device, for inputting and outputting the GTL-level output signal. The semiconductor integrated circuit device is not necessarily limited to the logic circuit and the data processing system. This may also be applied to a memory semiconductor integrated circuit device.

A description has been principally made of the transfer of the signal between the babyboards employed in the system to which the invention made by the present inventors has been applied and wherein the plurality of babyboard are mounted on the motherboard that falls within a field available by way of background to the invention. However, the present invention is not necessarily limited to it. As an alternative, the present invention can be applied to the commonly-used signal transfer made between the semiconductor integrated circuit devices.

Advantageous effects obtained by typical ones of the invention disclosed in the present application will be briefly described as follows:

Namely, the ringing of the waveform of the input signal can be greatly reduced and the circuits on the receiving side can be prevented from malfunctioning. Further, the signal transfer rate can be improved while the noise is prevented from appearing.

What is claimed is:

1. An semiconductor integrated circuit device comprising:
    an input/output terminal;
    a first output MOSFET having a source-drain path connected between said input/output terminal and a first source terminal;
    a second output MOSFET having a source-drain path connected between said input/output terminal and a second source terminal;
    a first gate drive signal generating circuit connected to a gate of said first output MOSFET, for selectively generating a drive signal to be supplied to the gate of said first output MOSFET in response to data to be transmitted;
    an input circuit having an input MOSFET whose gate is connected to said input/output terminal; and
    a second gate drive signal generating circuit connected to a gate of said second output MOSFET;
    said second gate drive signal generating circuit controlling an operation of said second output MOSFET so as to selectively generate a drive signal to be supplied to the gate of said second output MOSFET in response to data to be transmitted, complementarily to said first output MOSFET and second output MOSFET;
    said second gate drive signal generating circuit forming a control signal for temporarily turning on said second output MOSFET based on an input signal outputted from said input circuit in response to a high level input signal supplied to said input/output terminal upon data reception.

2. A semiconductor integrated circuit device according to claim 1, wherein said first gate drive signal generating circuit includes means for forming a gate drive signal for controlling a voltage applied to the gate of said first output MOSFET and allowing an output signal to rise and fall in accordance with a desired slew rate.

3. A semiconductor integrated circuit device according to claim 1, wherein said input circuit is a CMOS differential-type circuit.

4. A semiconductor integrated circuit device according to claim 1, wherein said first output MOSFET and said second output MOSFET are N channel MOSFETs.

5. A semiconductor integrated circuit device according to claim 1, wherein a potential at said input/output terminal is set as a GTL level.

6. A semiconductor integrated circuit device according to claim 1, wherein a gate width of said second output MOSFET is smaller than that of said first output MOSFET.

7. A semiconductor integrated circuit device comprising:
    an input terminal;
    an output MOSFET having a source-drain path connected between said input terminal and a source terminal;
    an input circuit having an input MOSFET whose gate is connected to said input terminal; and
    a gate drive signal generating circuit connected to a gate of said output MOSFET;
    said gate drive signal generating circuit forming a control pulse for temporarily turning on said output MOSFET based on a signal outputted from said input circuit in response to a high level input signal supplied to said input terminal.

8. A semiconductor integrated circuit device according to claim 7, wherein said input circuit is a MOS differential circuit.

9. A semiconductor integrated circuit device according to claim 7, wherein a potential at said input terminal is set as a GTL level.

10. A method of transmitting a signal, comprising the steps of:
    driving a pull-down output MOSFET provided in a first semiconductor integrated circuit device so as to be brought into an ON or OFF state in response to an output signal to be transmitted;
    supplying the output signal to a second semiconductor integrated circuit device through a bus line connected to at least one terminal resistor;
    judging the level of the output signal by a differential circuit provided in the second integrated circuit device; and
    temporarily bringing a pull-up output MOSFET provided in the second semiconductor integrated circuit device into an ON state when the output signal is judged as a high level signal at said judging step.

11. A method according to claim 10, further including a step of bringing a pull-up output MOSFET into an ON or OFF state complementarily to the pull-down output MOSFET.

12. A system for transmitting a signal, comprising:

a first semiconductor integrated circuit device having a pull-down output MOSFET activated so as to enter into an ON or OFF state in response to an output signal to be transmitted;

at least one terminal resistor;

at least one bus line connected to said terminal resistor and supplied with an output signal from said first semiconductor integrated circuit device; and a second semiconductor integrated circuit device having a pull-up output MOSFET connected to said bus line and a differential input circuit connected to said bus line and for judging the level of the output signal;

said second semiconductor integrated circuit device further including a control circuit for temporarily bringing the pull-up output MOSFET provided in said second semiconductor integrated circuit device into an ON state when the output signal is judged as a high level signal.

13. A system according to claim 12, wherein said first semiconductor integrated circuit device further includes a pull-up output MOSFET and a control circuit for bringing the pull-up output MOSFET into an ON or OFF state complementarily to the pull-down output MOSFET.

* * * * *